United States Patent
Anjo et al.

(10) Patent No.: US 6,241,094 B1
(45) Date of Patent: *Jun. 5, 2001

(54) SPOOL CASE OF BONDING WIRE

(75) Inventors: Tadao Anjo; Osamu Sato; Toshio Kaji, all of Tokyo; Keiichi Nishimura, Saga-ken, all of (JP)

(73) Assignee: Tanaka Denshi Kogyo Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/130,449

(22) Filed: Aug. 7, 1998

(30) Foreign Application Priority Data

Aug. 8, 1997 (JP) .................................................. 9-214783

(51) Int. Cl.[7] .................................................. B65D 85/66
(52) U.S. Cl. .................................................. 206/397; 206/408
(58) Field of Search .................................................. 206/389, 397, 206/407, 408, 398, 53, 54, 403; 242/170, 171

(56) References Cited

U.S. PATENT DOCUMENTS

| | | | |
|---|---|---|---|
| 1,640,368 | * 8/1927 | Obetz et al. | 260/403 |
| 2,867,319 | * 1/1959 | Jones et al. | 206/54 |
| 3,552,551 | * 1/1971 | Goldberg | 206/403 |
| 3,612,233 | * 10/1971 | Nagpal | 206/389 |
| 3,693,905 | * 9/1972 | Johnson | 206/389 |
| 4,903,833 | * 2/1990 | Beery | 206/407 |
| 5,205,412 | * 4/1993 | Krieg | 206/394 |
| 5,346,067 | * 9/1994 | Haufe et al. | 206/497 |
| 5,832,327 | * 11/1998 | Matsuura | 396/512 |

FOREIGN PATENT DOCUMENTS

| | | |
|---|---|---|
| 58-41188 | 9/1983 | (JP) . |
| 7-86326 | 3/1995 | (JP) . |
| 7161754 | 6/1995 | (JP) . |
| 9153510 | 6/1997 | (JP) . |
| 10326804 | 12/1998 | (JP) . |

OTHER PUBLICATIONS

A Partial English Translation of JP Publication No. 7–86326.
Patent Abstracts of Japan, vol. 1997, No. 10, Oct. 31, 1997(JP 9–153510).
Patent Abstracts of Japan, vol. 1999, No. 3, Mar. 31, 1999 (JP 10–326804).
Patent Abstracts of Japan, vol. 1995, No. 9, Oct. 31, 1995 (JP7–161754).
Patent Abstracts of Japan, vol. 1995, No. 6, Jul. 31, 1995(JP 7–86326).

* cited by examiner

Primary Examiner—Paul T. Sewell
Assistant Examiner—Shian Luong
(74) Attorney, Agent, or Firm—Greenblum & Bernstein, P.L.C.

(57) ABSTRACT

An object of the present invention consists in providing a new spool case in which the stored spool can be held without contacting with it by hand, engaging or disengaging of the spool in respect to the bonding device can be carried out without having any relation with a length of the holder or presence or non-presence of an engaging means, a reliability in holding the spool is high and a spool held state can be easily maintained. In addition, solving means of the present invention can be handled such that the spool is held by the engaging pieces 7 arranged at the base 3 and the spool is not directly contacted with hand. The spool held state is maintained by the resilient engaging force of each of the engaging pieces 7 and this is not released so long as each of these engaging pieces 7 is not resiliently deformed and is not released from the flange. The held state causes each of the engaging pieces 7 to be engaged with the outer circumferential edge of the flange, wherein no interference occurs against the wire wound around the spool barrel section section or inside the barrel section.

29 Claims, 9 Drawing Sheets

SPOOL CASE OF BONDING WIRE

BACKGROUND OF THE INVENTION

1. Field of the Invention

This invention relates to a spool case for a bonding wire for a semi-conductor, and more particularly a spool case in which the spool can be handled without being contacted with the bonding wire wound around the spool barrel section.

2. Description of the Prior Art

In the prior art, various kinds of structures have been known as a case in which the spool having the bonding wire wound therearound used in an assembling of a semi-conductor device is stored in it.

For example, the Japanese Utility Model Publication No. Sho 58-41188 discloses a spool case in which the case is comprised of a base having an upward expanded fitting ridge having the spool integrally fitted therein and a cover fitted to the outer circumferential ridge of the base, the cover is formed with a pressing concave section fitted to the spool in correspondence with the fitting ridge, the stored spool is pushed by the fitting ridge and the cover to prevent a looseness of.

In view of the fact, the spool stored in this kind of spool case was installed at the spool holder of the wire bonding device after being taken out at an assembling site of the semi-conductor device, although in the prior art, the flange of the spool in the prior art was held by hand, the hand was contacted with the surface of the wire, thereby there was a possibility that the wire damage was produced.

In order to eliminate the disadvantages, the Japanese Patent Laid-Open No. Hei 7-86326 discloses a spool case for a bonding wire in which the spool case is comprised of a base and a cover to be fitted to each other and at least one of the base and the cover is provided with the spool holding section capable of holding the spool and engaging or disengaging the spool without making any direct contact with hand to the spool.

SUMMARY OF THE INVENTION

However, detailed studying of the prior art spool case described in the aforesaid official gazettes of laid-open patent and utility model showed the following problems.

That is, in reference to the detailed description of the invention, the spool holding section of the spool case is constructed such that an inside part of a loaded wall contacted with the inner wall of the barrel section of the spool is provided with a concave section acting as an operating section for resiliently deforming the loaded wall, a finger inserted into the concave portion is opened outwardly or closed inwardly to cause the loaded wall to be resiliently deformed to adjust a contact pressure of the loaded wall against the inner wall of the barrel section.

In turn, the spool is loaded at the spool holder of the wire bonding device while being fitted from outside, although there are various kinds of lengths of the spool holder in reference to the bonding device, and in recent years, various kinds of spool holders having spool engaging means are proposed to accommodate for an increased weight of total spool as the length of the wire to be wound on the spool is elongated, wherein the engaging means is arranged at the spool holder so as to be contacted with the inner wall of the barrel section of the spool.

Accordingly, in the case that the prior art spool case having the loaded wall contacted with the inner wall of the barrel section of the spool to hold the spool, the spool holding section was struck against the extremity end of the spool holder or the spool engaging means to cause a certain trouble to be found in the installation of the spool.

In addition, the prior art spool case is constructed such that a contact pressure of the spool holding section is adjusted under an opening section or closing operation of the finger inserted into the concave section as described above, an erroneous operation of the finger is performed under a mistake of the operator causes the contacted state to be released and the spool is dropped.

The present invention has been invented in reference to the aforesaid circumstances in the prior art and its object consists in providing a new spool case in which the spool stored in the case can be held without contacting with the spool by hand, engaging or disengaging of the spool in respect to the bonding device can be carried out without having any relation with a length of the spool holder or presence or non-presence of the spool engaging means, a high reliability in holding of the spool can be attained, the spool holding state can be easily maintained.

In order to attain the aforesaid object, the present invention provides a spool case in which a spool for winding up the bonding wire is stored within the spool case comprised of the base and the cover to be fitted to each other and is characterized in that at least one of the base and the cover is provided with an engaging piece for holding the spool while being engageable with the outer circumferential edge of the flange of the spool.

In the case that the present invention is constructed as above, the spool is held by the base or the cover by the engaging pieces arranged in at least one of the base or the cover and the spool can be handled without making a direct contact of the spool. This held state is not released so long as it may not be released by deforming the engaging pieces. In addition, the held state is carried out such that the engaging pieces are engaged with the outer circumferential edge of the flange and held, and it is apparent that no interference is produced at either the wire wound around the spool barrel section or inside part of the spool barrel section.

The aforesaid engaging pieces are preferably of resilient material. In this case, although the engaging pieces are formed in such a way that they may be resiliently engaged with the flange, for example, it is also possible that either synthetic resin material having an appropriate resiliency or metallic material having spring characteristic such as a stainless steel or copper alloy or the like is applied to form a substantial leaf spring shape, a substantial claw shape and a substantial hook shape under wall thickness and size enabling an easy resilient deformation.

The engaging pieces are arranged such that they may be removably engaged with the outer circumferential edge of the flange of the spool. A plurality of the engaging pieces more than two are preferably arranged and more preferably a plurality of more than three engaging pieces are arranged. In addition, the engaging pieces can be formed into a continuous shape without being divided into a plurality of divided sections, resulting in that it can also be applied as the deformable structure.

It may be assumed that the engaging pieces are placed at at least either the base or the cover and also they may be arranged at inside part or outside part.

For example, in the case that the engaging pieces are arranged at the base, the plurality of engaging pieces having the substantial claw shape or the substantial hook shape are arranged at proper spacings along the outer circumferential edge of the flange at at least one of the inner surface of the base abutted against the outer surface of the flange of the stored spool or the outer surface of the base acting as a rear side of the inner surface.

In the case that the pieces are arranged at the cover, it can be illustrated that a plurality of engaging pieces of substantial leaf spring shape are properly spaced apart along the outer circumferential edge of the flange of the stored spool at the inner circumferential surface of the cover.

In the case that the engaging pieces are arranged at the inner surface of the base or the inner surface of the cover, it is possible to store the spool in the spool case under a state in which the spool is held at the base or the cover, and after opening section the case, the base or the cover holding he spool is handled to enable the spool to be handled without making any direct contact with hand to the spool.

In the case that the engaging pieces are arranged at the outer surface of the base, the base is turned over after opening section the case under a state in which the spool is stored in the cover, and the engaging pieces at the outside part of the base are resiliently engaged with the flange to cause the spool to be held at the base, the base is handled to enable the spool to be handled without making any direct contact to the spool by hand.

In addition, the engaging pieces can be separately and resiliently deformed from the base and the cover, resulting in that the engaging pieces are resiliently deformed by themselves to enable the engaging or disengaging with the flange to be carried out.

However, in this case, since an increased number of engaging pieces causes the operation to be troublesome, the base or the cover having the engaging pieces is moulded in such a way that it may be resiliently deformed, the engaging pieces are integrally formed at the base or the cover, the engaging pieces are integrally and resiliently deformed with the base or the cover to enable the spool to be engaged or disengaged.

In the case that the stored spool can be held under a state in which its central axis is held at a lateral substantial horizontal orientation, load of the wire, vibration during handling or transportation or the like and shock are dispersed in a substantial uniform manner over an entire length of the wire wound around the spool and then a collapsed wound state of the wire can be effectively prevented.

As means for holding it with the central axis of the spool being held under a state in which it is kept at a lateral orientation of a substantial horizontal direction, the lower end surface of the base is made flat or the mounting means capable of holding the horizontal state can be arranged.

The bonding wire wound around the spool is applied while its both ends are adhered to the flange section of the spool by a tape or the like. In the case that the wire is adhered to the outside section of the aforesaid flange, it is applied while the flange section is provided with a notch for use in passing the wire in it. The notch can be used while it is being fixed to either one side or both sides of the spool.

Both end flanges of the spool for winding the bonding wire are applied in the prior art in a diameter of 58.5 mm in this kind of technical field. In the present invention, a large diameter application is more effective and the diameter of 58.5 to 80 mm is preferably applied. In addition, it is also possible that only one side of large diameter is applied in view of the structure in an automatic bonding machine provided with the spool. In this case, it is preferable that the flange diameter is in a range of 58.5 to 80 mm.

It is preferable that the base is made such that a plurality of engaging sections resiliently engaged with the outer circumferential edge of the flange of the spool stored in the spool case are arranged at an inner surface of the outer circumferential ridge fitted to the cover, each of the engaging sections is integrally and resiliently deformed with the base so as to removably hold the spool, and at the same time the cover is provided with the expanded guiding ridge for loading it into the barrel section of the spool, the guiding ridge is formed to cause the spool to be guided when the spool case is opened or closed.

As a practical configuration of the guiding ridge, it is preferable to form it in a range that a length of the guiding ridge is ½ or more of a horizontal length (L) of the cover and projected only by ½ (L) from the opening section edge of the cover.

In addition, the base in the present invention is not limited to one acting as a container storing the spool, but the cover is not limited to one acting as a lid for closing the container, it may include the case in which the cover may act as the container and the base acts as the lid. I brief, if the spool can be stored in the spool case which is formed by the base and the cover fitted to each other, either the base or the cover may act as the container or the lid.

The spool case of the present invention includes an embodiment in which the spool having the bonding wire wound around it is stored in the spool case.

Application of the spool case of the present invention can be preferably used in this kind of technical field as a method for handling in which the spool can be handled without making any direct contact with the spool by hand.

BRIEF DESCRIPTION OF THE DRAWINGS

FIGS. 1–4B show an example I of a preferred embodiment, and wherein

FIG. 1 is a perspective view for showing one example of the preferred embodiment.

FIG. 2 is a sectional view taken along a line (A)—(A) of FIG. 1.

FIG. 3 is a sectional view taken along a line (B)—(B) of FIG. 2.

FIGS. 4A and 4B are sectional views for showing a state of use.

FIGS. 5–10B show an example II of a preferred embodiment, and wherein

FIG. 5 is a longitudinal sectional view for showing one example of the preferred embodiment.

FIG. 6 is a sectional view taken along a line (C)—(C) of FIG. 5.

FIG. 7 is a top plan view for showing a base.

FIG. 8 is a longitudinal sectional view for showing a state of use.

FIG. 9 is a longitudinal sectional view for showing a state of use.

FIGS. 10A and 10B are longitudinal sectional views for showing a state of use.

FIGS. 11 to 17 show an example III of a preferred embodiment, wherein

FIG. 11 is an exploded perspective view for showing an example of the preferred embodiment.

FIG. 12 is a front elevational view with a part being broken away to show a state of use.

FIG. 13 is an exploded longitudinal sectional view.

FIG. 14 is a top plan view for showing a base with a part being broken away.

FIG. 15 is a top plan view for showing a cover with a part being broken away.

FIG. 17 is a front elevational view for showing an example of the preferred embodiment.

DESCRIPTION OF THE PREFERRED EMBODIMENTS

Figure 1:
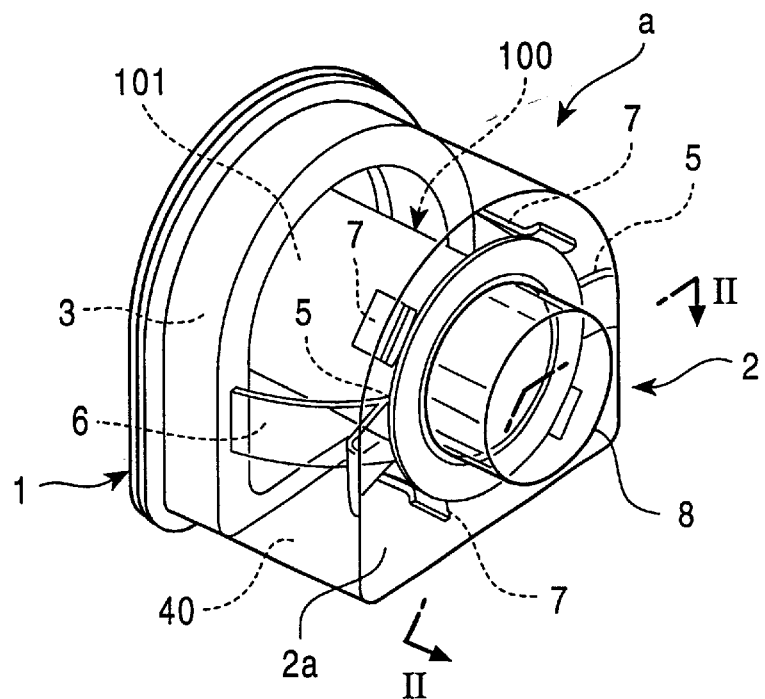
Figure 2:
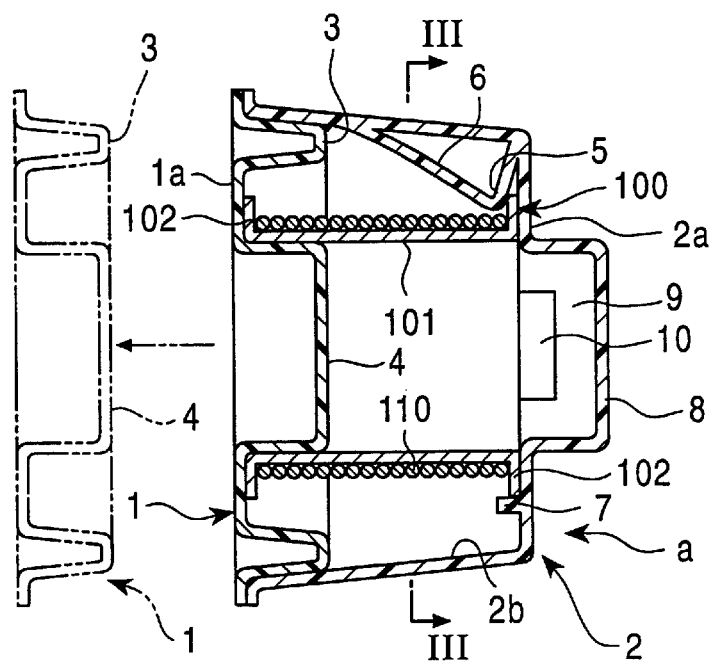

Referring now to the drawings, some preferred embodiments of the present invention will be described as follows.

EXAMPLE I OF THE PREFERRED EMBODIMENT: FIGS. 1 TO 4

In FIGS. 1 to 4, (a) denotes a spool case, 100 denotes a spool, 110 denotes a bonding wire, 200 denotes a spool holder of a bonding device and 300 denotes a spool engaging means installed at the holder.

The spool 100 is of a structure which is usually used in this field of technology, wherein the spool 100 is comprised of a cylindrical barrel section 101 around which the bonding wire 110 is wound, and lateral flanges 102, 102 arranged at both end opening section edges of the spool 100.

The spool case (a) is comprised of the base 1 and the cover 2 which are fitted to each other, wherein the base 1 and the cover 2 are made of plastic material or the like, they are molded by a vacuum molding process or the like, they are integrally molded in such a way that they may be resiliently deformed, the spool 100 around which the bonding wire 110 is wound is stored within the base 1, and the cover 2 is applied to cover it.

The base 1 has an outer circumferential ridge 3 fitted to the cover 2 at its outer circumferential edge and the central part of the side wall section 1a is formed with a projecting expanded guiding ridge 4 fitted inside the barrel section 101 of the spool 100 so as to guide the spool 100.

The guiding ridge 4 is of a flat circular shape having a substantial same diameter as or slight smaller diameter than an inner diameter of the barrel section 101 and a gradual cone shape having a slight fine taper, and formed in such a way that the base end of the guiding ridge 4 may be fitted to the barrel section 101. In addition, a projecting size of the guiding ridge 4 is substantially the same as a size of the outer circumferential ridge 3 and about ⅔ of a length of the spool 100.

The cover 2 is fitted to the outer circumferential ridge 3 of the base 1 so as to prevent the spool 100 from being loosed, wherein its depth is formed to be substantially the same length of the spool 100 and one flange 102 of the spool 100 is abutted against the side wall section 2a.

The inner circumferential surface 2b of the cover 2 is formed with a pair of engaging pieces 5, 5 for use in holding the flange 102 while being resiliently engaged with opposing two locations at the outer circumferential edge of one flange 102.

These engaging pieces 5 are arranged at opposing two locations of the circumferential wall of the cover 2, form a substantial leaf spring with the side wall section 2a at the fixing section 6 being bent back to form a mountain shape, hold the flange 102 together with the side wall section 2a and then the cover 2 holds the spool 100.

In addition, these engaging pieces 5 are formed to be integrally continuous with the cover 2 and formed to enable engagement or disengagement in respect to the flange 102 (that is, fixing or removing of the spool 100) to be carried out as both engaging pieces 5, 5 are resiliently deformed in an integral manner with the cover 2.

In this example, although the engaging pieces 5 are arranged at the aforesaid two locations, the number of engaging pieces 5 is not limited to this number, the engaging pieces can be arranged at a plurality of appropriate locations where the spool 100 can be held and its engaging or disengaging can be easily carried out.

The side wall section 2a of the cover 2 is provided with a plurality of stoppers 7. The stoppers 7 are comprised of some raised pieces raised at the inner sides of the predetermined locations which are abutted to and engaged with a plurality of appropriate locations at the outer circumferential edge of the flange 102 so as to prevent the spool 100 held by the cover 2 from being loosened.

In addition, the central part of the side wall section 2a of the cover 2 is formed integrally with a cylindrical holding section 8 in an outward expanded state. The holding section 8 may act as a holding means when the cover 2 is handled and at the same time a Concave section 9 inside the holding section 8 is corresponded to an inner side of the barrel section 101 of the spool 100 and also act as a relief section for an engaging means 300 arranged at the holder 200. 10 denotes a window hole arranged at a circumferential wall of the holding section 8, and the window hole 10 may also act as a relief section for the engaging means 300.

Figure 3:
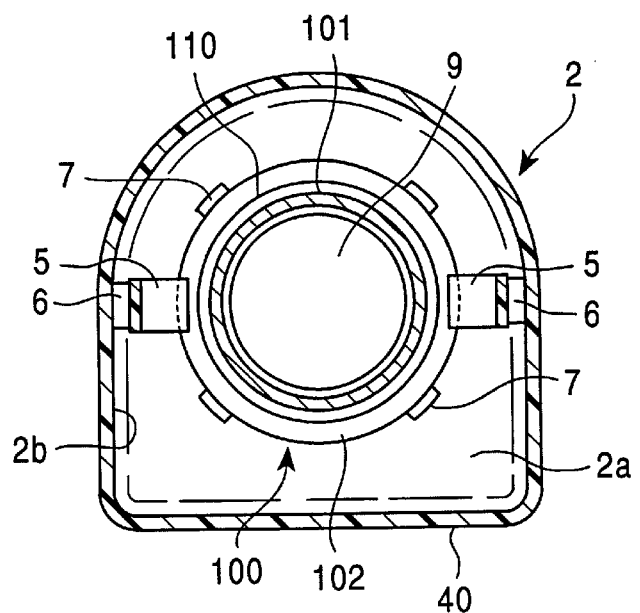

As shown in FIGS. 1 and 3, the aforesaid outer circumferential ridge 3 and the circumferential wall of the cover 2 are formed as a substantial semi-cylindrical shape, its partial section is formed as a flat surface, and the flat surface may act as a mounting plane (a mounting means) 40 when the spool case (a) storing the spool 100 therein is placed on a working table or the ike. That is, a wire is wound in a substantial equal manner against an axial direction, it is preferable to handle the spool 100 in such a manner as it may be faced laterally (such that the flanges 102, 102 are positioned laterally) so as to keep its state. If the spool case (a) is placed on the table or the like in such a way that the mounting surface, the handling described above can be carried out and at the same time it is possible to prevent the spool case (a) from being rolled.

In accordance with the spool case (a) of the present example constructed as described above, the spool 100 can be stored under a state in which the spool 100 is held at the cover 2, and after the base 1 and the cover 2 are separated from each other to open the case (a), the cover 2 held by the spool 100 is handled to enable the spool 100 to be handled without making any direct contact of hand with the spool 100.

The aforesaid held state is maintained by the resilient engaging force of the engaging pieces 5, 5 and this state may not be released so long as these engaging pieces 5, 5 are not resiliently deformed and not released from the flange 102. In addition, the aforesaid held state may act to cause each of the engaging pieces 5, 5 to be engaged with the outer circumferential edge of the flange 102 and held, and there is no interference for the wire 110 wound around the spool barrel section 101 or inside the barrel section 101.

Figure 4A:
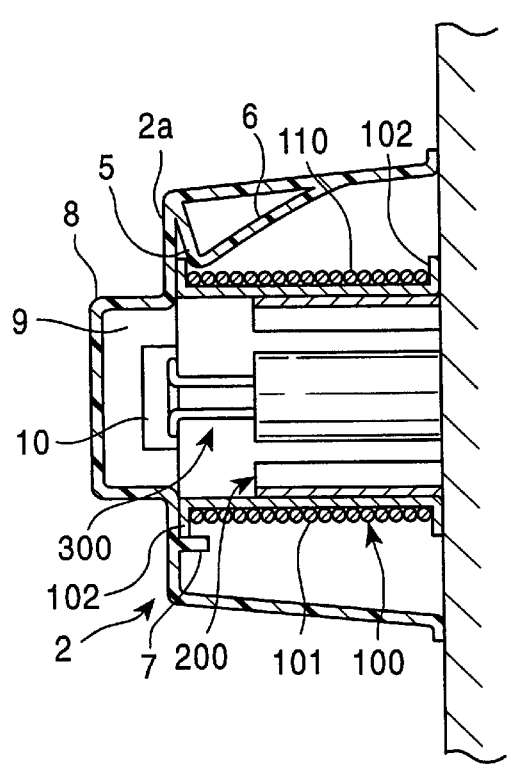
Figure 4B:
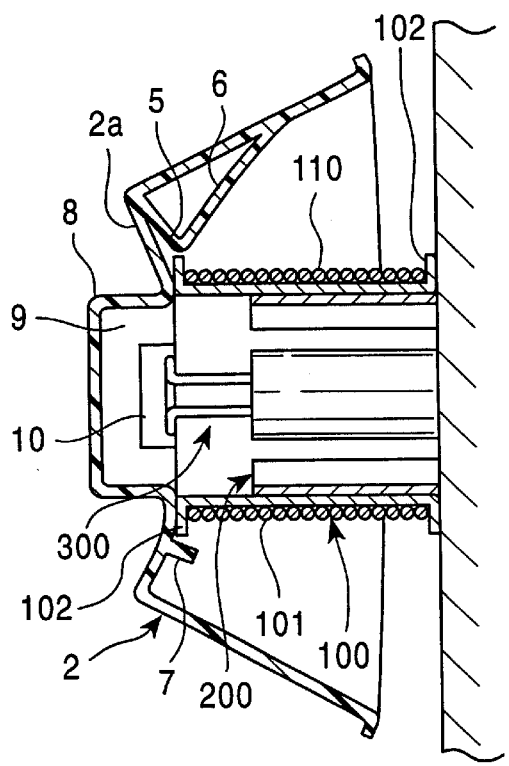
Figure 5:
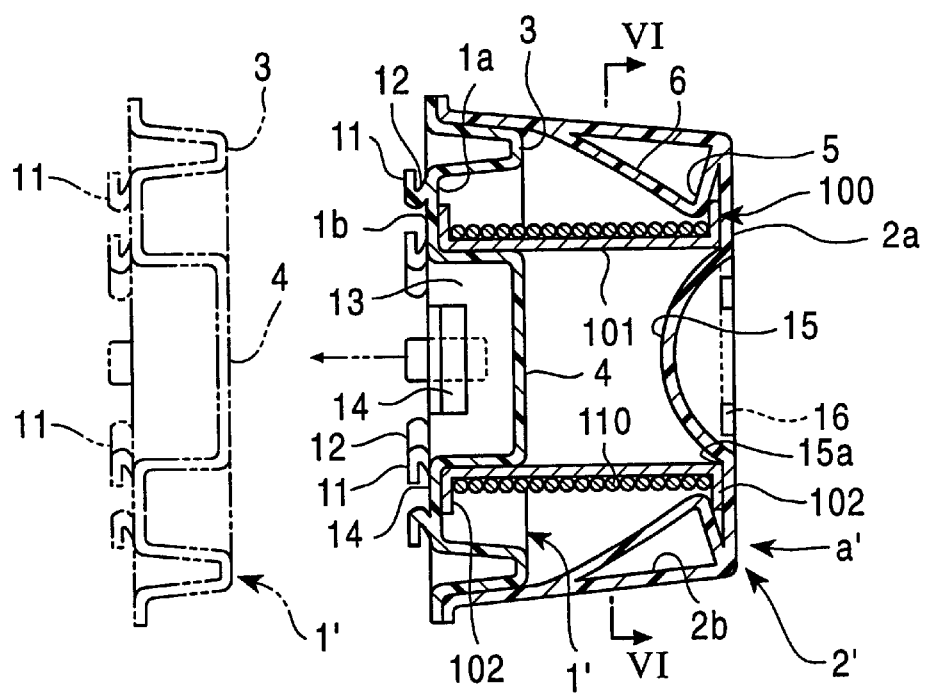
Figure 6:
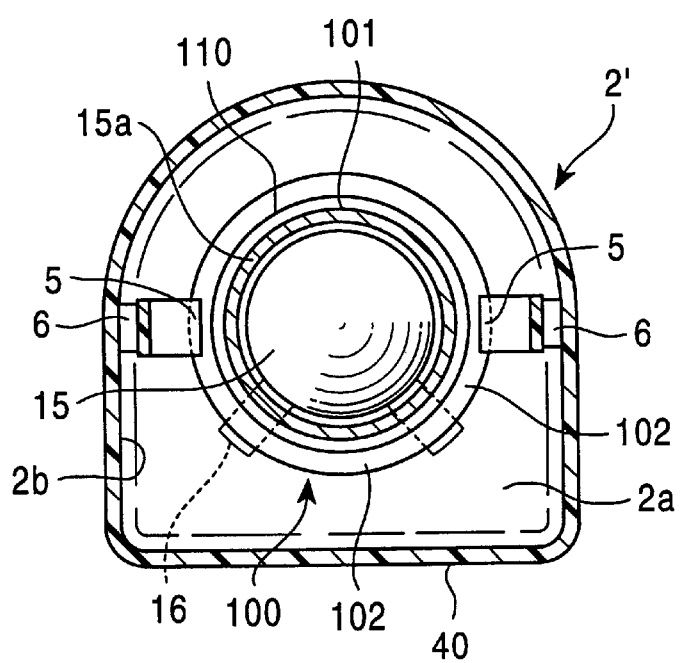
Figure 7:
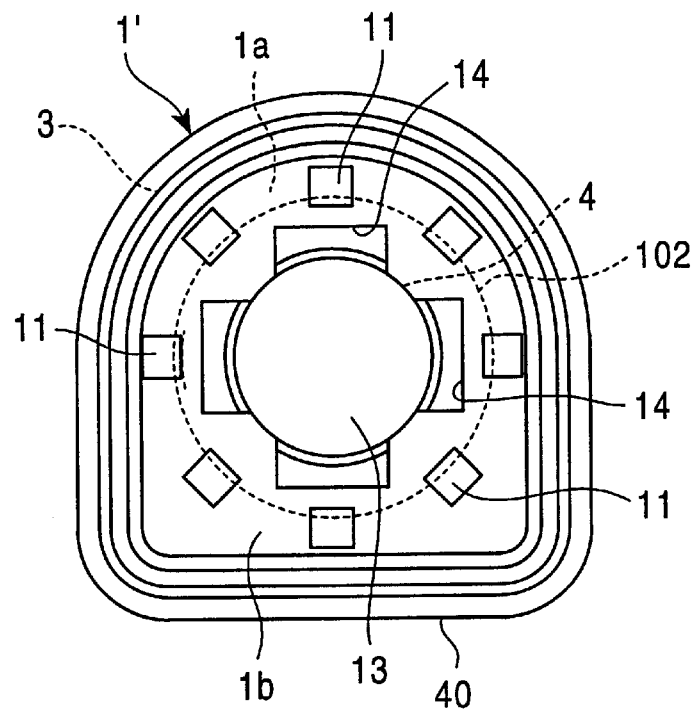

For example, in the case that the spool 100 is installed at the spool holder 200 of the wire bonding device, the holding section 8 is held by a hand to cause the cover 2 to be covered on the holder 200, the spool 100 is outwardly fitted to the holder 200 (refer to FIG. 4(a)), then if the cover 2 is resiliently deformed, the engaging pieces 5, 5 are also integrally deformed to release the engagement with the flange 102 (refer to FIG. 4(*b*)), and after this operation, if only the cover 2 is released, the spool 100 is installed in the holder 200.

In addition, under the state shown in FIG. 4(*a*), it is possible to release the spool engaging means 300 arranged at the holder 200 into the Concave section 9 or into the window hole 10, resulting in that the engaging means 300 does not hinder a spool installing work.

When the spool 100 is released from the holder 200, it is satisfactory that the aforesaid work is performed in a reverse order (FIGS. 4(*b*) to (*a*)) to hold the spool 100 with the cover 2.

EXAMPLE II OF THE PREFERRED EMBODIMENT: FIGS. 5 TO 10

A spool case (a') shown in FIGS. 5 to 10 is comprised of a base 1' and a cover 2' mutually fitted to each other, wherein the base 1' and the cover 2' are, at their almost portions, constructed in the same manner as that of the aforesaid base 1 and the cover 2, although it is characterized in that the spool 100 held in the cover 2' is replaced in the base 1' so as to handle the spool 100.

The composing sections which are common to those described in the example I are denoted by the same reference numerals as those in the example I in the drawings, their overlapping description will be eliminated and only their different points will be described as follows.

The base 1' is provided with a plurality of engaging pieces 11 at a surface (that is, the outer surface) 1*b* corresponding to the outside part of the case at the side wall section 1*a*, the engaging pieces are resiliently engaged with a plurality of proper locations at an outer circumferential edge of the flange 102 to held the flange 102.

Figure 8:
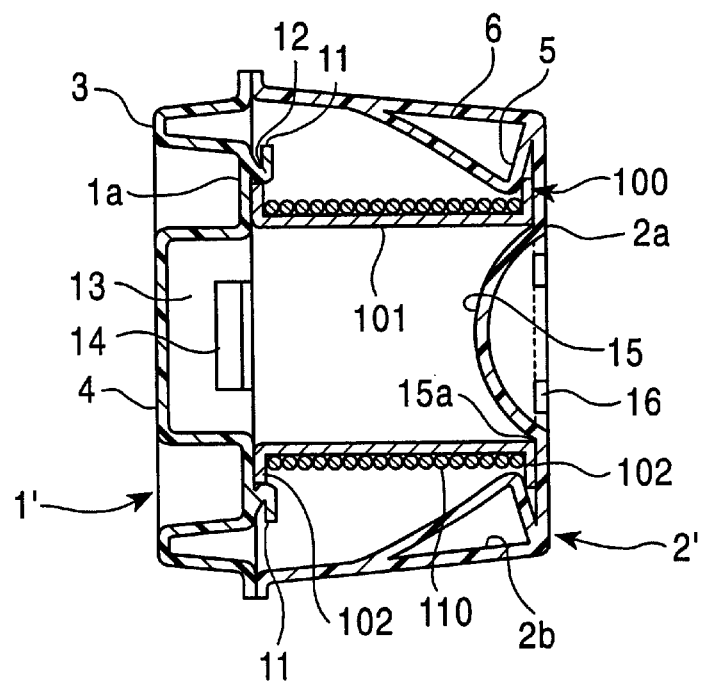

These engaging pieces 11 are formed such that they are fixed to a plurality of appropriate locations at the outer surface 1*b* of the base 1', the extremity ends at the fixing sections 12 are bent back into a substantial claw-like shape or a substantial hook-like shape, thereby they correspond to appropriate spacings along the outer circumferential edge of the flange 102, and as shown in FIG. 8, under a state in which the base 1' is turned over (upside down), the flange 102 is held together with the outer surface 1*b* so as to hold the spool 100 at the base 1'.

In addition, these engaging pieces 11 are formed integrally with the base 1', more particularly the outer circumferential ridge 3, thereby as each of the engaging pieces 11 is resiliently deformed in integral with the outer circumferential ridge 3, the engaging or disengaging against the flange 102 (that is, fixing or removing of the spool 100) can be carried out.

Although the engaging pieces 11 are equally spaced apart to correspond to eight locations along the outer circumferential edge of the flange 102 in this example, the number of engaging pieces 11 is not restricted to this number, and they may be arranged at a plurality of appropriate locations where the spool 100 can be held and its fixing or removing can be carried out.

In addition, the guiding ridge 4 in this example may act as a handle member to handle the base 1' and at the same time the concave section 13 inside the guiding ridge 4 is corresponded to the inside part of the barrel section 101 of the spool 100 to act a releasing section for the engaging means 300 arranged at the holder 200. 14 denotes a window hole opened from the side wall section 1*a* over the circumferential wall of the guiding ridge 4, wherein the window hole 14 may also act as a releasing section for the engaging means 300.

Although the cover 2' is provided with a pair of aforesaid engaging pieces 5, 5, but is not provided with the stopper 7, holding section 8, concave section 9 and window hole 10, and the side wall section 2*a* is provided with a pressing concave section 15.

The pressing concave section 15 corresponds to the guiding ridge 4, coincides with and fits to the inside part of the barrel section 101 of the spool 100, and this is formed such that it may be projected in a substantial semi-spherical form with the central part of the side wall section 2*a* being faced inside. In addition, the pressing concave section 15 is formed to have such a diameter as one in which it may abut at an outer edge section 15*a* against an outer end of the inner circumference of the barrel section 101.

The side wall section 2*a* of the cover 2' is provided with a plurality of projections 16 which are positioned outside the outer edge section 15*a* and projected inwardly in proper spacings.

The projections 16 are formed to have such a depth as one in which their projecting end surfaces are abutted and engaged with the outer surface of the flange 102 so as to prevent an axial looseness of the spool 100.

In accordance with the spool case a' in the example constructed as described above, the spool 100 is held by the guiding ridge 4 and the pressing concave section 15 and at the same time the spool 100 can be stored under a state in which a pair of engaging pieces 5, 5 are resiliently engaged with one flange 102 to hold the spool 100 at the cover 2'. After the base 1' and the cover 2' are separated to open the case a', the spool 100 can be handled without performing a direct contact with the spool 100 by hand by handling the cover 2' in which the spool 100 is held.

Figure 9:
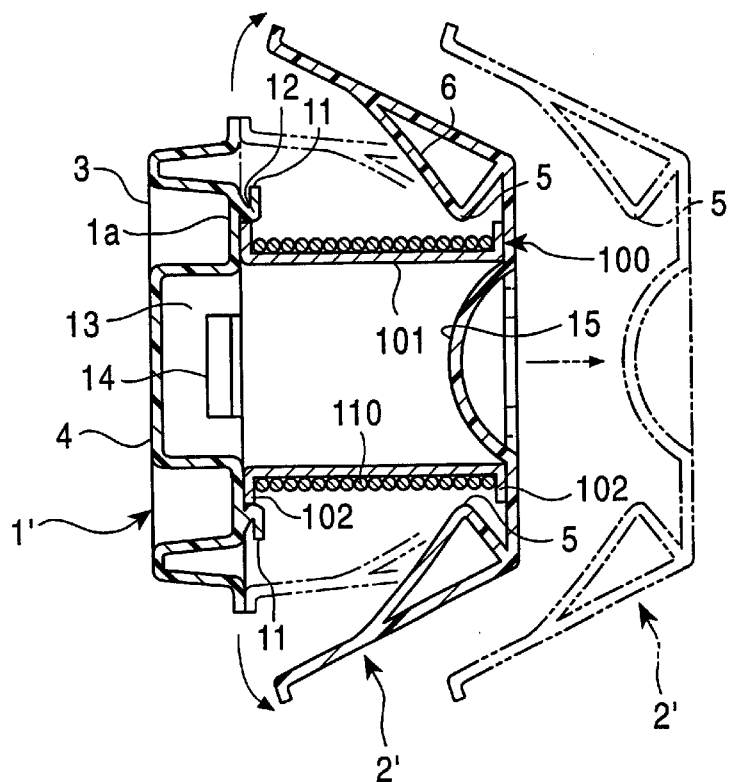

In addition, as shown in FIG. 8, if the base 1' is turned back (upside down) to cause each of the engaging pieces 11 to be resiliently engaged with the other flange 102 of the spool 100 and thereafter the engaged state of the engaging pieces 5, 5 is released, the spool 100 is held at the base 1' and the spool 100 can be handled without performing a direct contact with the spool 100 by hand by handling the base 1' (refer to FIGS. 8 and 9).

The held state is maintained by a resilient engaging force of each of the engaging pieces 11 and this is not released so long as these engaging pieces 11 are not resiliently deformed and not released from the flange 102. In addition, the held state causes each of the engaging pieces 11 to be engaged with the outer circumferential edge of the flange 102 and held, resulting in that no interference is produced against the wire 110 wound around the spool barrel section 101 or inside the barrel section 101.

Figure 10A:
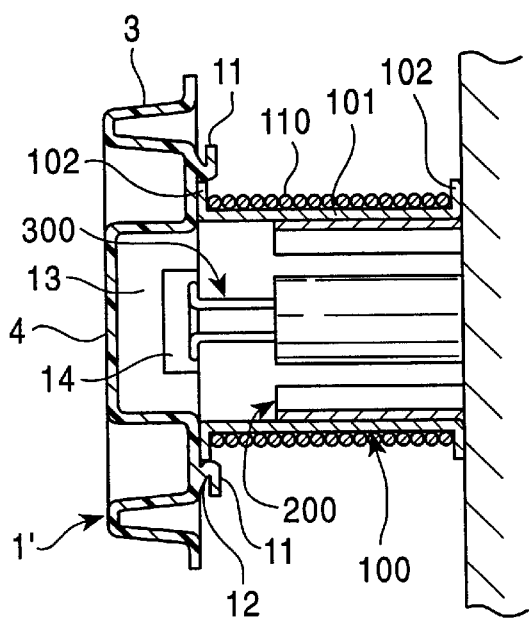
Figure 10B:
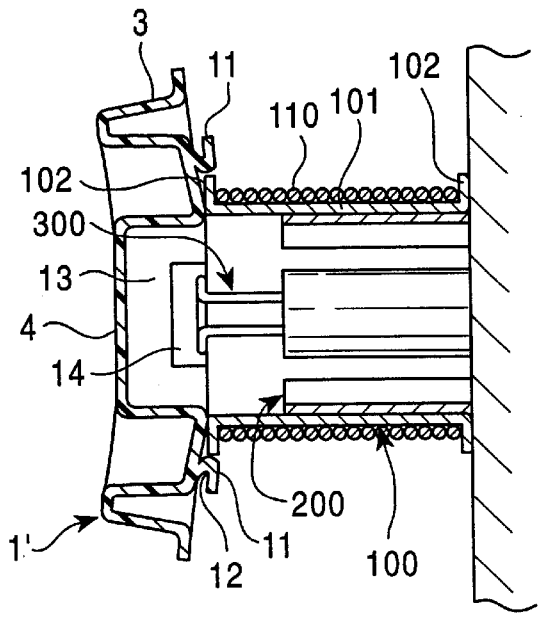

For example, in the case that the spool 100 is installed at the spool holder 200, the outer circumferential ridge 3 is held by hand to cause the base 1' to be covered on the holder 200, wherein the spool 100 is outwardly fitted to the holder 200 (refer to FIG. 10(*a*)), then each of the engaging pieces 11 is integrally and resiliently deformed to cause the outer circumferential ridge 3 to be resiliently deformed in an outward direction (refer to FIG. 10(*b*)), thereafter if only the base 1' is released, the spool 100 is installed at the holder 200.

In addition, under the state shown in FIG. 10, it is possible to release the spool engaging means 300 arranged at the holder 200 into the concave section 13 or into the window hole 14, resulting in that the engaging means 300 does not become an inteference in the spool installing operation.

When the spool 100 is removed from the holder 200, it is satisfactory that the aforesaid work is performed in a reverse order (FIGS. 10(*b*) to (*a*)) to cause the spool 100 to be held at the base 1'.

EXAMPLE III IN THE PREFERRED EMBODIMENT: FIGS. 11 TO 19

Figure 11:
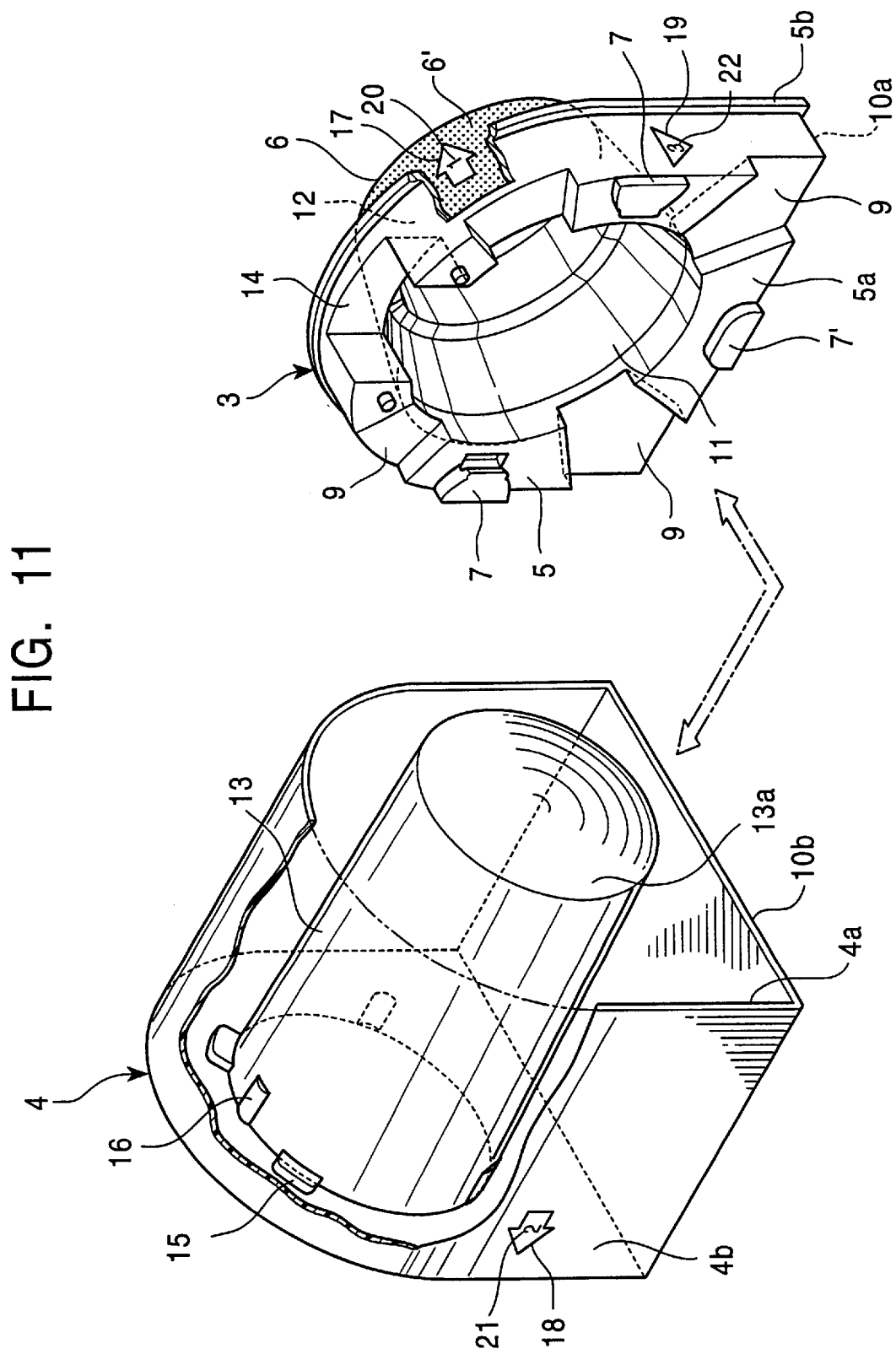
Figure 12:
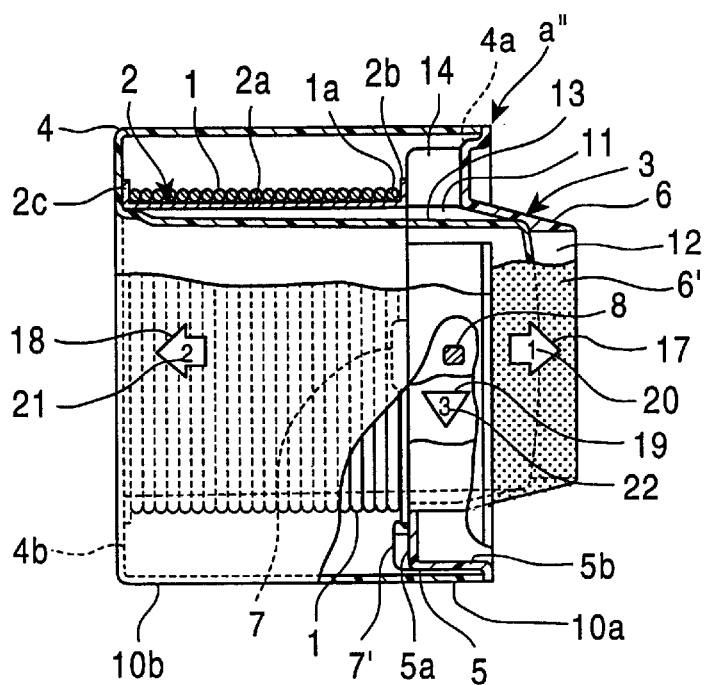
Figure 13:
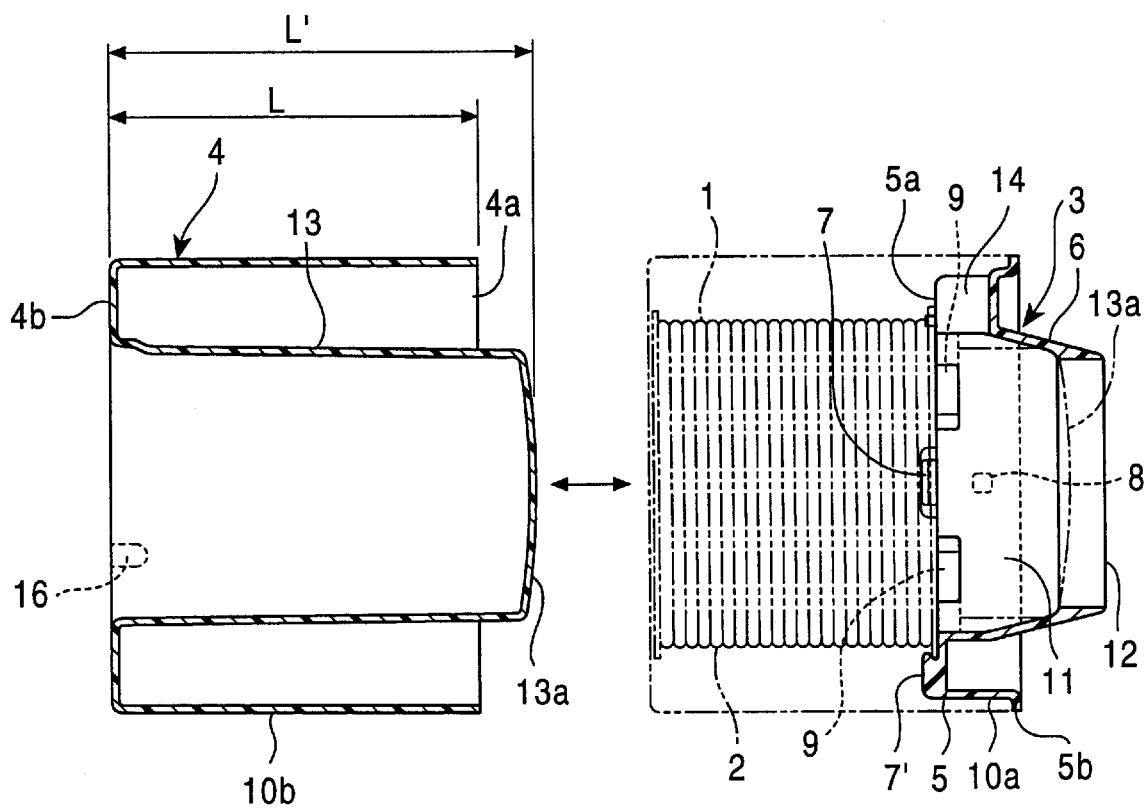
Figure 14:
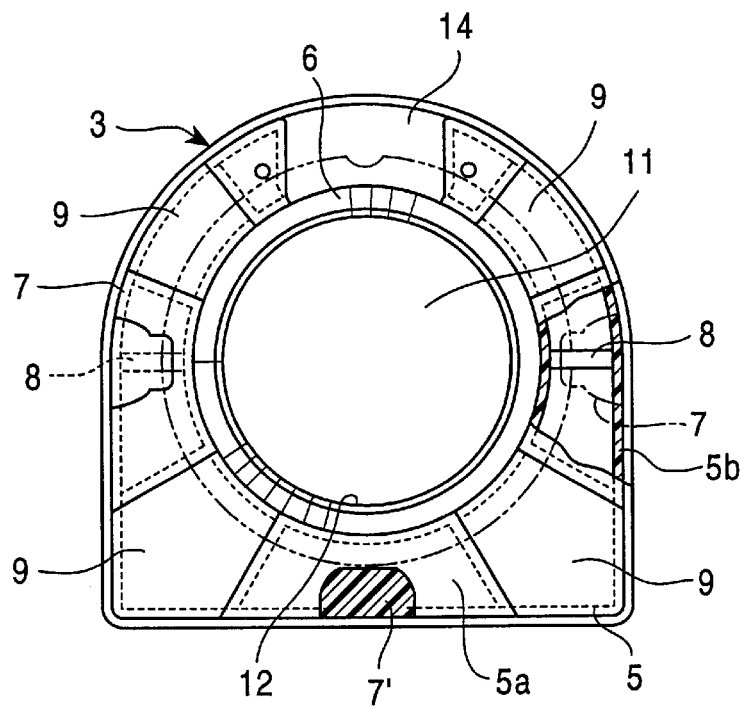
Figure 15:
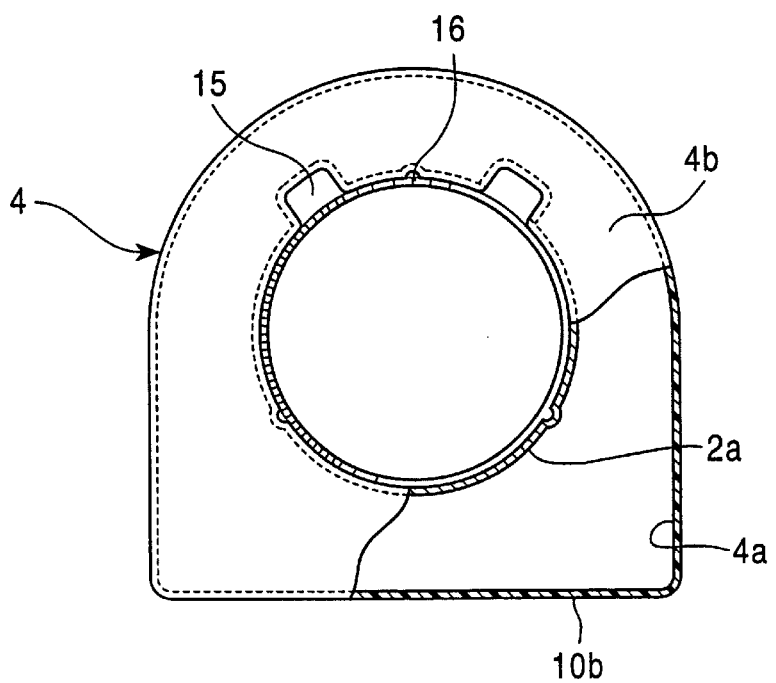

The spool case a" shown in FIGS. 11 to 17 is comprised of a base 3 and a cover 4 which are mutually fitted to each other as shown in FIGS. 11 to 13, and the spool 2 having the bonding wire 1 wound around it is stored in the spool case.

The spool 2 is provided with flanges 2b, 2c at both ends thereof. These flanges 2b, 2c are formed such that their diameters are in a range of 58.5 to 80 mm.

The spool case a" is comprised of a base 3 and a cover 4 which are mutually fitted to each other, wherein the base 3 and the cover 4 are made of plastic material or the like, they are moulded integrally by a vacuum molding method in a resilient deformable manner, the spool 2 having the bonding wire 1 wound therearound is held at the base 3 and the cover 4 is fitted to it from a side part.

The base 3 is provided with an outer circumferential ridge 5 fitted to an opening section edge 4a of the cover 4 at its outer circumferential section, and an expanded holding section 6 projected outwardly of the spool case a" is integrally arranged with the outer circumferential ridge 5 at the central section enclosed by the outer circumferential ridge 5.

In addition, the base 3 is provided with a plurality of engaging sections 7 for use in removably holding the spool 2.

A plurality of engaging sections 7 are arranged along the outer circumferential edge of the flange 2b for appropriate spacings at an inner surface 5a acting as a top surface of the outer circumferential ridge 5, i.e. the inner surface 5a abutted against the outer surface 2b' of the flange 2b of the spool 2 held at the base 3, the extremity end of each of the engaging sections is formed into a substantial claw-like or a substantial hook-like shape so as to be resiliently engaged with the outer circumferential edge of the flange 2b, each of the engaging sections 7 is engaged with the outer circumferential edge of the flange 2b to cause the flange 2b to be removably held, thereby the spool 2 is removably held at the base 3 in its canti-levered state.

Each of the engaging sections 7 is integrally formed with the outer surface 5a of the outer circumferential ridge 5, each of the engaging sections 7 is integrally and resiliently deformed with the outer circumferential ridge 5 and it is formed in such a way that its engaging or disengaging against the flange 2b (i.e. the engaging or disengaging of the spool 2) can be carried out.

In the present example, the right and left two engaging sections 7 are arranged to be corresponded to the right and left two locations at the outer circumferential edge of the flange 2b, the engaging section 7' not provided with the substantial claw-shape or substantial hook-shape section is abutted against the lower end of the outer circumferential edge of the flange 2b so as to enable the flange 2b to be supported and then the flange 2b is removably held by these three engaging sections, although the number or shape or installing positions of each of the engaging sections or the like is not limited to this, but a proper number of engaging sections removably engaged with the flange 2b, capable of holding the spool 2 and enabling its engaging or disengaging to be carried out can be arranged at appropriate locations.

A rib 8 is integrally arranged in correspondence with each of the engaging sections 7 at the outer surface of the outer circumferential ridge acting as a rear surface of the inner surface 5a, when the outer end edge 5b of the outer circumferential ridge is resiliently deformed inwardly, each of the engaging sections 7 is resiliently deformed in its opening section direction around a fulcrum point of this rib 8 and then the engaging or disengaging against the flange 2b may easily be carried out.

The inner surface 5a of the outer circumferential ridge 5 is provided with a plurality of appropriate releasing concave sections 9 corresponding to the projecting section of the spool holder 200 (for example, the engaging means 300 or the like) without producing any interference against the formation of the engaging sections 7 and in a range where strength, durability and resiliency required in the base 3 are maintained.

With such an arrangement as above, this is preferable due to the fact that when the spool 2 held at the base 3 is installed at the spool holder 200, the engaging means 300 are released into the concave sections 9 to facilitate its handling and then its applicability is improved.

In addition, the wider concave sections 9 are preferable. As the concave sections are wide, a positional alignment for the projecting sections (the engaging means 300 or the like) of the spool holder 200 is facilitated and an installing of the spool 2 against the spool holder 200 becomes more easy and at the same time its applicability in usage is further improved. In addition, a more simple shape of each of the concave sections 9 can prevent dust from being adhered and allows a washing of it to be easily carried out.

The lower surface of the outer circumferential ridge 5 is formed with a flat mounting surface 10a which is formed as a mounting means, and the mounting surface 10a and the mounting surface 10b of the cover 4 to be described later may form a mounting means capable of holding the spool 2 stored in the spool case a" under a lateral-directed state in which a central axis of the spool shows substantially a horizontal state.

The holding section 6 is formed such that a cylindrical surface is integrally formed outwardly from the inner end edge of the inner surface 5a of the outer circumferential ridge 5 to the spool case a", it may act as a handle when the base 3 is handled, and an accidental deformation of the engaging sections 7 can be prevented. That is, in the case that the holding section 6 is not provided, the outer circumferential ridge 5 may act as a holding section, although in this case, there may occur a possibility that as the outer circumferential ridge 5 is deformed accidentally, the engaging sections 7 are deformed and the spool 2 is dropped off. In view of this fact, the holding section 6 is provided as disclosed in the present example, and when the base 3 is handled, the holding section 6 is applied as a handling section, resulting in that an accidental deformation of the engaging sections 7 can be prevented.

The surface of the holding section 6 may form an anti-slipping section 6' by applying a mat finish (an anti-slipping processing) and its holding is made positive.

A space 11 inside the holding section 6 is corresponded to the inner side of the cylindrical barrel section 2a of the spool 2 held at the base 3 to act as a releasing section for the projecting part (the engaging means 300 or the like) of the spool holder 200.

In addition, the expanded end part of the holding section 6 is not closed, but formed as an opening section 12, wherein the opening section 12 is applied as a hole for releasing corresponded to the engaging means 300 of the spool holder 200 or the like.

In addition, the holding section 6 is formed as a substantial cone-pyramid shape with its outer diameter being gradually decreased from its projecting base end to the extremity end, the bases 3 can be closely overlapped from each other to reduce a cost when the bases 3 are stored and transported or the like.

The cover 4 is fitted to the outer circumferential ridge 5 of the base 3 to cover the spool 2, wherein its depth is formed to be substantially the same degree as a length of the spool 2 and then the flange 2c of the spool 2 is abutted against the side surface wall 4b.

A circumferential wall of the cover 4 is formed into a substantial semi-cylindrical form which can be fitted to the outer circumferential ridge 5 and at the same time its lower surface is formed with a flat mounting surface 10b so as to form the mounting means as described above.

The mounting means can hold the spool 2 while the central axis of the spool 2 is in a lateral directed state in a substantial horizontal direction when the spool case a" storing the spool 2 therein is placed on the working table or in a transporting case or the like, thereby the load of the wire 1 itself, vibration during its handling or transportation or the like or shock is distributed over an entire length of the wire 1 in a substantial uniform manner, resulting in that a collapsed winding of the wire 1 can be prevented effectively and further a rolling of the spool case a" may also be attained.

Within the cover 4 is arranged the expanded guiding ridge 13 loaded into the cylindrical barrel section 2a of the spool 2 to be held by the base 3, the spool 2 in the spool case a" is held at the base 3 in a canti-levered state and concurrently it is held at the cover 4 by the guiding ridge 13 to cause the holding of the spool 2 to be made positive.

In addition, the projecting end of the guiding ridge 13 is projected out of the opening section edge 4a of the cover 4 and when the base 3 and the cover 4 are fitted to each other, the guiding ridge 13 becomes a guide to feed the spool 2 toward the center of the cover 4 in such a way that the bonding wire 1 wound around the spool 2 held at the base 3 may not be contacted with the opening section edge 4a of the cover 4.

The guiding ridge 13 is formed such that its length (L') is set in a range more than ½ of a horizontal length (L) of the cover 4 and projecting only by an amount of ½ (L) from the opening section edge of the cover, thereby when the spool case a" is opened or closed, the bonding wire 1 wound around the spool 2 is guided in such a way that it is not contacted with the opening section edge 4a of the cover 4.

In addition, the guiding ridge 13 is made such that a portion projected from the cover opening section edge 4a is freely inserted into the inner space 11 of the holding section 6, and its projecting end 13a is fitted to the opening section 12 at the end of the holding section 6 so as to form the opening section 12 in such a way that it can be closed.

In addition, the guiding ridge 13 is formed into a substantial cone pyramid shape with its outer diameter being gradually decreased from its base end toward the extremity end, the covers 4 can be closely stucked up to reduce a cost when the covers 4 are stored and transported or the like.

The wire 1 wound around the cylindrical barrel section 2a of the spool 2 is set such that its winding finished end is stopped by a tape at the flange 2b, although in the present example, the outer circumferential ridge 5 of the base 3 is provided with the concave section 14 exposing the tape stopping end 1a.

The concave section 14 is arranged at the upper surface of the outer circumferential ridge 5 while being oppositely faced against the mounting surface 10a acting as the mounting means, the spool 2 is held by the base 3 to be exposed in such a way that the tape stopping end 1a is positioned within a range of opening section of the concave section 14, thereby the tape stopping end 1a of the spool 2 held at the base 3 can be peeled off without using any special tool such as tweezers.

In addition, since the tape stopping end 1a is exposed at the upper end of the base 3, the tape peeling-off operation can be adapted for both rightward operation and leftward operation.

15 in the figure denotes a pressing section formed in a concave shape at the side wall section 4b of the cover 4 so as to be abutted against the outer surface of the flange 2c of the spool 2 loaded into the guiding ridge 13. 16 denotes a pressing section projected at the outer circumference of the guiding ridge 13 so as to be abutted against the inner circumference of the cylindrical barrel section 2a of the spool 2. The pressing section 15 prevents an axial looseness of the spool 2 and the pressing section 16 prevents a looseness of the spool 12 in a direction toward the diameter.

In view of the foregoing, this kind of spool case is recovered after its use, it is passed through inspection, cleaning and drying operations and repeatedly used, although in the present example, the locations of all the corners in the aforesaid base 3, the cover 4, for example, the corners at the concave portions of the releasing concave portion 9, concave portion 14 and pressing sections 15, 16 or the like and the cooperative corners between the inner surface 5a at the outer circumferential ridge 5 and the holding section 6 are formed as curved surfaces having a R more more, a water splashing action at the drying step after cleaning can be performed rapidly and positively.

In addition, in the present example, an order of taking out the spool 2 stored in the spool case a" is displayed at a proper location of the spool case a".

That is, the holding section 6 in the base 3 and each of the outer ends of the cover 4 are provided with outward-directed arrows 17, 18 for acknowledging a separation of the base 3 and the cover 4 to be fitted to each other, and a triangular symbol 19 for acknowledging a pressing location for performing a resilient deformation of the outer end edge 5b in an inward direction, deforming the engaging section 7 and removing the spool 2 is arranged near the engaging section 7 of the outer circumferential ridge 5. In addition, the arrows 17, 18 and the symbol 19 are provided with numerals 20, 21, 22.

The spool case of the present example constructed as described above is made such that each of the engaging sections 7 of the inner surface 5a of the outer circumferential ridge 5 in the base 3 is resiliently engaged with the outer circumferential edge of the flange 2b of the spool 2 around which the bonding wire 1 is wound, the spool 2 is held at the base 3, the base 3 and the cover 4 are fitted to each other while the guiding ridge 13 is being inserted into the cylindrical barrel section 2a of the spool 2 and then the spool 2 can be stored in the spool case a".

In this way, the spool case a" is handled in such a way that the mounting surfaces 10a, 10b are faced down, the stored spool 2 is held in such a way that its central axis may become substantially a horizontal orientation so as to prevent a collapsing of winding of the wound bonding wire 1.

In addition, after the base 3 and the cover 4 are separated from each other to open the spool case a", the base 3 having the spool 2 held therein is handled to enable the engaging or disengaging of the spool 2 to be carried out without performing any direct contact of the spool with hand.

That is, the held spool 2 is maintained by the resilient engaging force of each of the engaging sections 7, this held state is not released so long as these engaging sections 7 are resiliently deformed and released from the flange 2b. In addition, the held state holds it by engaging each of the engaging sections 7 to the outer circumferential edge of the flange 2b, wherein there occurs no interference against the wire 1 wound around the spool cylindrical barrel section 2a or the inside part of the cylindrical barrel section 2a.

Figure 16A:
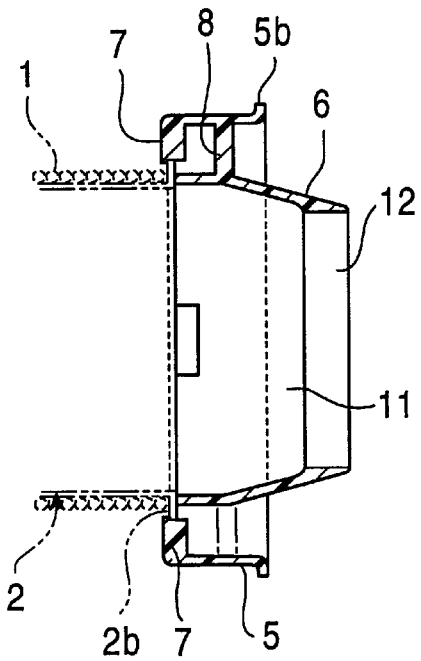
FIGS. 16A and 16B are longitudinal sectional views for showing a state of use.
Figure 16B:
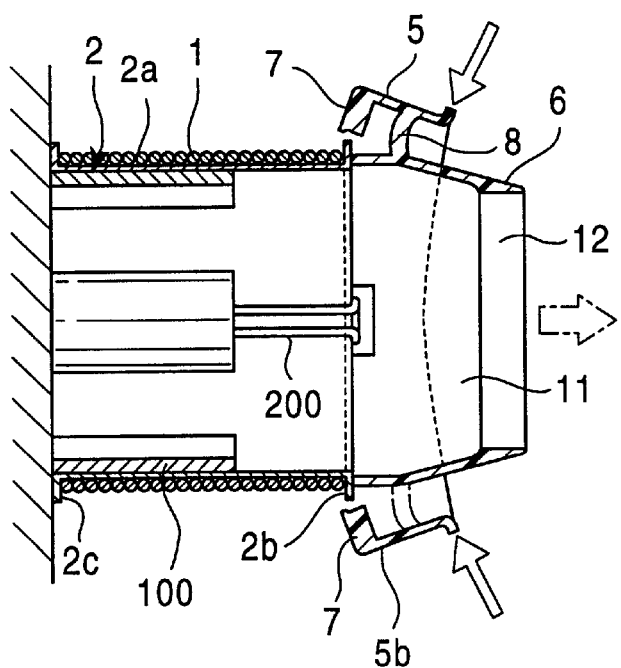

For example, in the case that the spool 2 is installed at the spool holder 200, the holding section 6 is held to cover the base 3 on the holder 200, the spool 2 is outwardly fitted to the holder 200, and if the outer end edge 5b of the outer circumferential ridge 5 is deformed inwardly, each of the engaging sections 7 is integrally and resiliently deformed to release the engaged state of the flange 2b, thereafter when only the base 3 is released, the spool 2 is installed at the holder 200 (refer to FIG. 16).

During this operation, it is possible to release the spool engaging means 300 accompanied by the holder 200 into the concave sections 9, space 11 and the opening section 12 or the like, resulting in that the engaging means 300 does not interfere with the spool installing operation.

When the spool 2 is removed from the holder 200, it is satisfactory that the aforesaid operation is carried out and then the spool 2 is held by the base 3.

With the foregoing, although several preferred embodiments of the present invention have been described, the present invention is not restricted to these preferred embodiments and other different preferred embodiments can be attained if they are within a scope of the technical concept described in the claim of the present invention.

Figure 17:
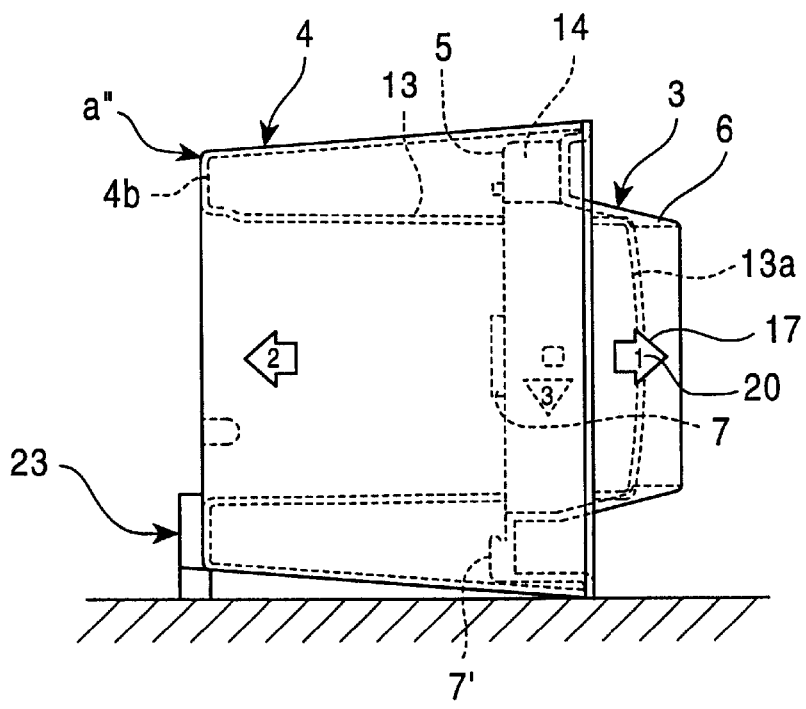

For example, FIG. 17 shows an arrangement in which the aforesaid mounting surfaces 10a, 10b are not formed, but the lower end surface of the spool case a" is applied as a slant surface and in turn the lower end surface is provided with a leg 23 for holding the spool 2 in such a way that its central axis may become horizontal so as to form the mounting means.

In addition, if the leg 23 is formed to be foldable, it is preferable that the base 3 and the cover 4 can be closely stucked up to each other.

In addition, if any one of or both of the base and the cover are made transparent, it is preferable that the type and the standards of the wire 1 wound around the spool 2 can be acknowledged.

For a sake of convenience in illustration, although the bonding wire 1 is shown in a larger diameter than that of the actual wire and a single layer winding is applied to the spool 2, it is apparent that the wire 1 is a fine wire with a diameter of less than 1 mm, the wire is wound in multi-layer around the spool 2 and the extremity end of the engaging section 7 is formed in such a size as one in which it may not be contacted with the surface layer of the wire 1 wound around in multi-layer.

The effects of the present invention are arranged in an order of the claims as follows.

Claim 1

The engaging piece arranged at the base or the cover is engaged with the outer circumferential edge of the flange to enable the spool to be held at either the base or the cover.

Accordingly, the spool can be replaced with another one without damaging the wire or the like under a direct contact of the surface of the wire with hand and there is provided a general applicability that the accommodation for various kinds of bonding devices can be attained without being influenced by a length of the spool holder or the spool engaging means or the like.

In addition, since the flange held condition is maintained by the engaging pieces, the present invention may provide an effect that even if the operator hands off the device, a high reliable handling in operation can be realized.

Claim 2

It can be expected in the present invention that a positive characteristic in holding the spool described above and an operability in deforming the engaging piece to release the held condition can be improved.

Claim 3

In the case that the engaging piece is arranged in either the base or at the inner surface of the cover, it is possible to store the spool in the spool case under a state in which the spool is held at the base or the cover and it can contribute to an improvement of prevention of the looseness in the spool.

Claim 4

In the case that the engaging piece is integrally and resiliently deformed with either the base or the cover, the base or the cover is operated, resulting in that each of the engaging pieces is integrally and resiliently deformed to enable a fixing or a removing of the spool to be carried out and then a workability in operation can be improved more.

Claim 5

In the case that the spool is held in a lateral directed state in such a way that its central axis may become substantially a horizontal orientation, a load of the wire itself, vibration or shock during handling of or transportation of the wire itself are dispersed in a substantial uniform manner over an entire length of the wire which is wound around the spool, resulting in that a collapsing of wound wire can be effectively prevented.

Claim 6

A spool with its diameter of either one of or both end flanges being in a range of 58.5 to 80 mm is processed and the engaging pieces are formed in such a way that they may be resiliently engaged with the outer circumferential edge of the flange, so that for example, it is possible to accommodate for various kinds of spools like the spool having both flanges with same diameter from each other or the spool having one flange with a larger diameter than that of the other flange. In particular, in the case that the spool with one flange having a larger diameter than that of the other flange is processed, the present invention hay have a more superior effect under a mutual multiplication of one advantage provided in the spool itself and the other advantage in which the flange of larger diameter is held to handle the spool and the contact with the bonding wire wound around the spool can be reduced even if a winding amount is increased to attain a wound fat state.

Claim 7

Since the spool is guided by the guiding ridge arranged in the cover when the spool case is opened or closed, the bonding wire wound around the spool is not contacted with the opening section edge of the cover and the spool can be handled.

Claim 9

If the spool case of the present invention is used, the present invention can be used preferably in this kind of technical field as a handling method in which the spool can be handled without making a direct contact with the spool by hand.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope of the invention as defined by the appended claims.

What is claimed is:

1. A spool case for storing a spool having a center axis and including at least one flange with an outer axial face and an inner axial face perpendicular to the center axis of the spool, and an outer circumferential edge face extending along a direction substantially parallel to the center axis of the spool and connecting the outer axial face and the inner axial face, said spool case comprising:

a base and a cover axially fitted to each other along an axial direction corresponding to the direction of the center axis of the spool and readily detached from one another along the axial direction, at least one of said base and said cover having a plurality of engaging pieces formed thereon that removably engage and support the outer circumferential edge face of the flange of the spool in at least a horizontal position of the spool when said base and said cover are detached from one another; and said at least one of said base and said cover supporting the spool to be transported when said base and said cover are detached from one another, via the engagement of said engaging pieces to the outer circumferential edge face of the flange and the support of said engaging pieces of the outer circumferential edge face of the flange when said base and said cover are detached from one another.

2. The spool case according to claim 1, further comprising:

a holding section formed on said at least one of said base and said cover, by which said at least one of said base and said cover is held to be transported when said base and said cover are detached from one another, said holding section being formed to be held substantially coaxially with the position in which the spool is engaged and supported.

3. The spool case according to claim 2, said holding section being formed having a diameter substantially the same size as an inner diameter of a correspond spool.

4. The spool case according to claim 1, wherein more than two engaging pieces are formed on said at least one of said base and said cover.

5. The spool case according to claim 1, wherein said plurality of engaging pieces are arranged at an inner surface of said at least one of said base and said cover, said inner surface being a surface of said at least one of said base and said cover that is internal to said spool case when said base and said cover are fitted together.

6. The spool case according to claim 5, wherein said engaging pieces engage the flange of the spool when said base and said cover are fitted together.

7. The spool case according to claim 5, wherein said plurality of engaging pieces, each shaped substantially as a hook, are arranged at an inner surface of the base in positions to abut an outer surface of the flange, at a predetermined spacing about a circle corresponding to the outer circumferential edge of the flange.

8. The spool case according to claim 5, wherein said plurality of engaging pieces, each shaped substantially as a leaf spring, are arranged in an inner circumferential surface of the cover, at a predetermined spacing about a circle corresponding to the outer circumferential edge of the flange.

9. The spool case according to claim 1, wherein said plurality of engaging surface are arranged at an outer surface of said base, said outer surface being a surface of said base that is external to said spool case when said base and said cover are fitted together.

10. The spool case according to claim 9, wherein the flange is supported to be transported by said engaging pieces when said base and said cover are separated from one another, said at least one of said base and said cover is turned over, and said engaging pieces are then engaged to the flange.

11. The spool case according to claim 9, wherein said plurality of engaging pieces, each shaped substantially as a hook, are arranged at said outer surface of the base on a rear side of said base with respect an inner surface of the base, at a predetermined spacing about a circle corresponding to the outer circumferential edge of the flange.

12. The spool case according to claim 1, wherein said cover includes a supporting surface parallel to a central axis of a spool held in said spool case when said base and said cover are fitted together as an assembled spool case, so that the central axis of the spool held in said spool case is substantially horizontal when said assembled spool case rests on said supporting surface.

13. A spool case for storing a spool having at least one flange with an outer circumferential edge, said spool case comprising:

a base and a cover to be fitted to each other and separated from one another, at least one of said base and said cover having a plurality of engaging pieces formed thereon that removably engage and support the outer circumferential edge of the flange of the spool in at least a horizontal position of the spool when said base and said cover are separated from one another;

said at least one of said base and said cover thereby supporting the spool via said engaging pieces to be transported when said engaging pieces engage and support the outer circumferential edge of the flange of the spool and when said base and said cover are separated from one another; and wherein said at least one of said base or said cover is resiliently deformable, and at least one of said plurality of engaging pieces are unitarily and resiliently deformed with said at least one of said base or said cover when engaging and disengaging the flange.

14. A spool case for storing a spool having at least one flange with an outer circumferential edge, said spool case comprising:

a base and a cover to be fitted to each other and separated from one another, at least one of said base and said cover having a plurality of engaging pieces formed thereon that removably engage and support the outer circumferential edge of the flange of the spool in at least a horizontal position of the spool when said base and said cover are separated from one another;

said at least one of said base and said cover thereby supporting the spool via said engaging pieces to be transported when said engaging pieces engage and support the outer circumferential edge of the flange of the spool and when said base and said cover are separated from one another; and the spool having a barrel section, wherein said base comprises:

an inner circumferential ridge that fits said cover, said inner circumferential ridge being provided with a plurality of engaging sections arranged in positions to resiliently engage the outer circumferential edge of the flange of the spool when the spool is stored in the spool case, each of the engaging sections being unitarily and resiliently deformed when said base is deformed, thereby releasing the spool, and said cover comprises:

an expanded guiding ridge fitting the barrel section of the spool, said guiding ridge guiding the spool both when said base and said cover of said spool case are fit together and when said base and said cover of said spool case are separated from one another.

15. An assembled spool case, comprising:

a spool having a center axis and including at least one flange with an outer axial face and an inner axial face perpendicular to the center axis of said spool, and an outer circumferential edge face extending along a direction substantially parallel to the center axis of said spool and connecting said outer axial face and said inner axial face;

bonding wire wound about said spool to form a wound spool; and a spool case having a base and a cover axially fitted to each other along an axial direction corresponding to the direction of the center axis of said spool and readily detached from one another along the axial direction, at least one of said base and said cover having a plurality of engaging pieces formed thereon that removably engage and support the outer circumferential edge face of the flange of the spool in at least a horizontal position of the spool when said base and said cover are detached from one another, said at least one of said base and said cover supporting the spool to be transported when said base and said cover are detached from one another, via the engagement of said engaging pieces to said outer circumferential edge face of said flange and the support of said engaging pieces of said outer circumferential edge face of said flange when said base and said cover are detached from one another, said wound spool being stored in said spool case.

16. The assembled spool case according to claim 15, said spool case further comprising:

a holding section formed on said at least one of said base and said cover by which said at least one of said base and said cover is held to be transported when said base and said cover are detached from one another, said holding section being formed to be held substantially coaxially with the position in which the spool is engaged and supported.

17. A method for handling a spool case and spool having a center axis and including at least one flange with an outer axial face and an inner axial face perpendicular to the center axis of the spool, and an outer circumferential edge face extending along a direction substantially parallel to the center axis of the spool and connecting the outer axial face and the inner axial face, comprising:

engaging a plurality of engaging pieces formed on at least one of a base and a cover to only one outer circumferential edge face of the spool and supporting said only one outer circumferential edge face of the spool by said engaging, said at least one flange having said only one outer circumferential edge face being adjacent said at least one of a base and a cover of the spool case with no other flange intervening therebetween;

holding with a handler's hand said at least one of a base and a cover of the spool case; and transporting said spool without any direct contact between the spool and the handler's hand, by transporting said at least one of said base and said cover by the handler's hand and transporting the outer circumferential edge face of the flange of the spool via said the engaging of said engaging pieces to said outer circumferential edge face of said flange and the supporting of said outer circumferential edge face of said flange by said engaging pieces, so that said spool is supported at only one end via said outer circumferential edge face of said flange when said base and said cover are detached from one another.

18. The method according to claim 17, wherein said holding comprises:

holding a holding section of said at least one of said base and said cover, said holding section being formed to be held substantially coaxially with the position in which the spool is engaged and supported.

19. An assembled spool case, comprising:

a spool having a center axis and including at least one flange with an outer axial face and an inner axial face perpendicular to the center axis of the spool, and an outer circumferential edge face extending along a direction substantially parallel to the center axis of the spool and connecting the outer axial face and the inner axial face, and having wound thereon a bonding wire, said bonding wire having a diameter of 58.5 to 80 mm; and a base and a cover axially fitted to each other along an axial direction corresponding to the direction of the center axis of said spool as the assembled spool case, at least one of said base and said cover having a plurality of resiliently deformable engaging pieces formed thereon, each resiliently deformable engaging piece having a proximal end integral with said at least one of said base and said cover and a distal end remote therefrom in the axial direction, said plurality of resiliently deformable engaging pieces being arranged in positions to resiliently deform at only the distal end thereof in a direction away from said spool and to removably engage and support the outer circumferential edge face of the flange of the spool in at least a horizontal position of the spool when said base and said cover are detached from one another.

20. The assembled spool case according to claim 19, further comprising:

a holding section formed on said at least one of said base and said cover by which said at least one of said base and said cover is held to be transported when said base and said cover are detached from one another, said holding section being formed to be held substantially coaxially with the position in which the spool is engaged and supported.

21. A spool case for storing a spool having a center axis and including at least one flange with an outer axial face and an inner axial face perpendicular to the center axis of the spool, and an outer circumferential edge face extending along a direction substantially parallel to the center axis of the spool and connecting the outer axial face and the inner axial face, said spool case comprising:

a base and a cover axially fitted to each other along an axial direction corresponding to the direction of the center axis of the spool as the assembled spool case, at least one of said base and said cover having a plurality of resilient engaging pieces formed thereon, each resiliently deformable engaging piece having a proximal end integral with said at least one of said base and said cover and a distal end remote therefrom in the axial direction, said plurality of resiliently deformable engaging pieces being spaced in a peripheral circle of an inner diameter of substantially the same size as the outer circumferential edge face of the flange and arranged in positions to resiliently deform at only the distal end thereof in a direction away from the spool and to removably engage and support the outer circumferential edge face of the flange of the spool when said base and said cover are detached from one another.

22. The spool case according to claim 21, further comprising:

a holding section formed on at least one of said base and said cover, by which said at least one of said base and said cover is held to be transported, said at least one of said base and said cover thereby supporting said engaging pieces when said engaging pieces engage and support the outer circumferential edge of the flange of the spool.

23. A spool case for storing a spool having a center axis and including at least one flange with an outer axial face and an inner axial face perpendicular to the center axis of the spool, and an outer circumferential edge face extending along a direction substantially parallel to the center axis of the spool and connecting the outer axial face and the inner axial face, said spool case comprising:

a base and a cover axially fitted to each other along an axial direction corresponding to the direction of the center axis of the spool and readily detached from one another along the axial direction, at least one of said base and said cover having an engaging portion of substantially a same inner dimension as the outer circumferential edge face of the flange of the spool and adapted to removably engage and support the outer circumferential edge face of the flange of the spool when said base and said cover are detached from one another, said at least one of said base and said cover supporting the spool to be transported when said base and said cover are detached from one another, via the engagement of said engaging portion to said outer circumferential edge face of said flange and the support of said engaging portion of said outer circumferential edge face of said flange when said base and said cover are detached from one another; and a holding section by which said at least one of said base and said cover is held to be transported when said base and said cover are detached from one another, said holding section formed on said at least one of said base and said cover substantially opposite said engaging portion and projecting in a direction away from said engaging portion, said spool being transported together with all of said at least one of said base and said cover having said holding section, said holding section, and said engaging portion when said engaging portion engages and supports the outer circumferential edge face of the flange of the spool as said base and said cover are detached from one another.

24. A method of mounting a wound spool onto a machine with a spool case having a base and a cover, the method comprising:

holding at least one of the base and the cover, said at least one of said base and said cover having a plurality of engaging pieces formed thereon that removably engage and support an outer circumferential edge of a flange of the wound spool;

separating said base and said cover from one another, the outer circumferential edge of the flange being supported to be transported by said engaging pieces and the spool being thereby supported to be transported by said at least one of said base and said cover and removed from a remaining one of said base and said cover;

transporting the spool:

placing the wound spool on said machine via said at least one of said base and said cover; and deforming said at least one of said base and said cover via a disengaging section, at least one of said plurality of engaging pieces releasing the outer circumferential edge of the flange of the spool when said at least one of said base and said cover is deformed so that said wound spool is released and mounted on the machine without direct contact between an operator's hand and the spool.

25. The method according to claim 24, wherein said holding comprises holding a holding section formed on said at least one of said base and said cover, and said separating comprises separating said base and said cover from one another via said holding section.

26. A spool case for storing a spool having at least one flange with an outer circumferential edge, the spool case comprising:

a base and a cover to be fitted to one another and separated from one another, at least one of said base and said cover having:

a plurality of engaging pieces that removably engage and support the outer circumferential edge of the flange of the spool, so that when said base and said cover are separated from one another, the outer circumferential edge of the flange is supported to be transported by said engaging pieces and the spool is thereby supported to be transported by said at least one of said base and said cover and removed from a remaining one of said base and said cover; and a disengaging section adapted for a user's hand to deform said at least one of said base and said cover, at least one of said plurality of engaging pieces releasing the outer circumferential edge of the flange of the spool when said at least one of said base and said cover is deformed via said disengaging section.

27. The spool case according to claim 26, further comprising:

a holding section adapted for a user's hand to hold when said base and said cover are separated from one another.

28. A spool case for storing a spool having at least one flange with an outer circumferential edge at one axial end of the spool, said spool case comprising:

a base and a cover fitted to each other as the assembled spool case, at least one of said base and said cover having a plurality of resilient engaging pieces adapted to engage and support the outer circumferential edge of the flange at only the one axial end of the spool and support the spool in cantilevered fashion, such that a remaining axial end of the spool is free.

29. The spool case according to claim 28, further comprising:

a holding section formed on at least one of said base and said cover, for holding said at least one of said base and said cover to be transported and thereby supporting the spool via said engaging pieces when said engaging pieces engage and support the outer circumferential edge of the flange of the spool.

* * * * *

UNITED STATES PATENT AND TRADEMARK OFFICE
CERTIFICATE OF CORRECTION

PATENT NO. : 6,241,094 B1  
DATED : June 5, 2001  
INVENTOR(S) : T. Anjo et al.

Page 1 of 1

It is certified that error appears in the above-identified patent and that said Letters Patent is hereby corrected as shown below:

<u>Column 15,</u>  
Line 38, "correspond" should be -- corresponding --.

Signed and Sealed this

Sixteenth Day of April, 2002

Attest:

JAMES E. ROGAN  
*Director of the United States Patent and Trademark Office*

*Attesting Officer*